(12) United States Patent
Wang

(10) Patent No.: US 11,658,657 B1
(45) Date of Patent: May 23, 2023

(54) ANTENNA TUNING SWITCH AND SYSTEM WITH A BYPASS FUNCTION INTEGRATED IN AN RFIC

(71) Applicant: Infineon Technologies AG, Neubiberg (DE)

(72) Inventor: Kun Wang, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/667,311

(22) Filed: Feb. 8, 2022

(51) Int. Cl.
*H03K 17/687* (2006.01)
*H01Q 1/50* (2006.01)

(52) U.S. Cl.
CPC ........... *H03K 17/6871* (2013.01); *H01Q 1/50* (2013.01)

(58) Field of Classification Search
CPC .............................. H03K 17/6871; H01Q 1/50
See application file for complete search history.

(56) References Cited

U.S. PATENT DOCUMENTS

| 9,685,687 | B2 | 6/2017 | Solomko et al. |
| 9,837,324 | B2* | 12/2017 | Blin ................. H01L 29/41733 |
| 2012/0081262 | A1* | 4/2012 | Tanaka ................. H03K 17/693 |
| | | | 343/876 |
| 2012/0249270 | A1* | 10/2012 | Li ............................ H04B 1/18 |
| | | | 334/78 |
| 2015/0054698 | A1 | 2/2015 | Kerr et al. |
| 2019/0296436 | A1 | 9/2019 | Desclos et al. |
| 2019/0363440 | A1 | 11/2019 | Samardzija et al. |
| 2021/0160878 | A1 | 5/2021 | Samardzija et al. |
| 2021/0399748 | A1 | 12/2021 | Wang |

FOREIGN PATENT DOCUMENTS

EP 3016200 A1 5/2016

* cited by examiner

*Primary Examiner* — Metasebia T Retebo
(74) *Attorney, Agent, or Firm* — Slater Matsil, LLP

(57) ABSTRACT

An integrated circuit includes a first stacked transistor switch having a current path coupled between a first tuning element port and a second tuning element port; a second stacked transistor switch having a current path coupled between the first tuning element port and a ground port; and a control circuit coupled to a control node of the first stacked transistor switch and coupled to a control node of the second stacked transistor switch, wherein a series on-resistance of the first stacked transistor switch is greater than a series on-resistance of the second stacked transistor.

18 Claims, 10 Drawing Sheets

ANTENNA TUNING SWITCH AND SYSTEM WITH A BYPASS FUNCTION INTEGRATED IN AN RFIC

TECHNICAL FIELD

The present invention relates generally to an antenna tuning switch and system with a bypass function integrated in a radio frequency integrated circuit (RFIC), and to a corresponding method.

BACKGROUND

In some radio frequency (RF) devices, inductive or capacitive antenna tuning elements may be selectively coupled to an antenna. One approach for antenna tuning is sometimes referred to as aperture tuning, where the inductive or capacitive antenna tuning elements are selectively coupled between the antenna and ground, for example at a node between the antenna and radio frequency communication circuitry coupled to the antenna. This is, for example, used for band selection in mobile phones which are able to communicate in different frequency bands. Various approaches of how to selectively couple the tuning elements to the antenna are known, for example in shunt type switches, series type switches and in a series type switch with a so-called "resonance stopper." While such tuning approaches may improve device performance in some cases, it may also lead to power losses and unwanted resonances in the system.

SUMMARY

According to an embodiment, an integrated circuit comprises a first stacked transistor switch having a current path coupled between a first tuning element port and a second tuning element port; a second stacked transistor switch having a current path coupled between the first tuning element port and a ground port; and a control circuit coupled to a control node of the first stacked transistor switch and coupled to a control node of the second stacked transistor switch, wherein a series on-resistance of the first stacked transistor switch is greater than a series on-resistance of the second stacked transistor.

According to an embodiment, a system comprises an antenna tuning circuit comprising a first tuning element; a first stacked transistor switch having a current path coupled between a first node of the first tuning element and a second node of the first tuning element; a second stacked transistor switch having a current path coupled between the first node of the first tuning element and ground; and a control circuit coupled to a control node of the first stacked transistor switch and coupled to a control node of the second stacked transistor switch, wherein a series on-resistance of the first stacked transistor switch is greater than a series on-resistance of the second stacked transistor.

According to an embodiment, a method comprises receiving a first tuning element voltage of a first tuning element at a first switch port; receiving a second tuning element voltage of the first tuning element at a second switch port; selectively coupling the first switch port to the second switch port through a first stacked transistor switch; and selectively coupling the second switch port to ground through a second stacked transistor switch, wherein a series on-resistance of the first stacked transistor switch is greater than a series on-resistance of the second stacked transistor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to an embodiment, an RFIC for tuning an antenna comprises a first stacked transistor switch coupled between a first tuning element port and a second tuning element port; a second stacked transistor switch coupled between the first tuning element port and a ground port; and a control circuit coupled to the first stacked transistor switch and coupled to a control node of the second stacked transistor switch. The RFIC advantageously reduces voltage stress during switching transients while maintaining acceptable power losses during an OFF mode of operation. While the RFIC is described in detail below, and shown in corresponding drawing figures, additional descriptions of stacked transistor antenna tuning switches are provided in co-pending case U.S. patent application Ser. No. 17/339,018, filed on Jun. 4, 2021, and entitled "Switch Device, System and Corresponding Methods," which is hereby incorporated by reference in its entirety.

Figure 1:
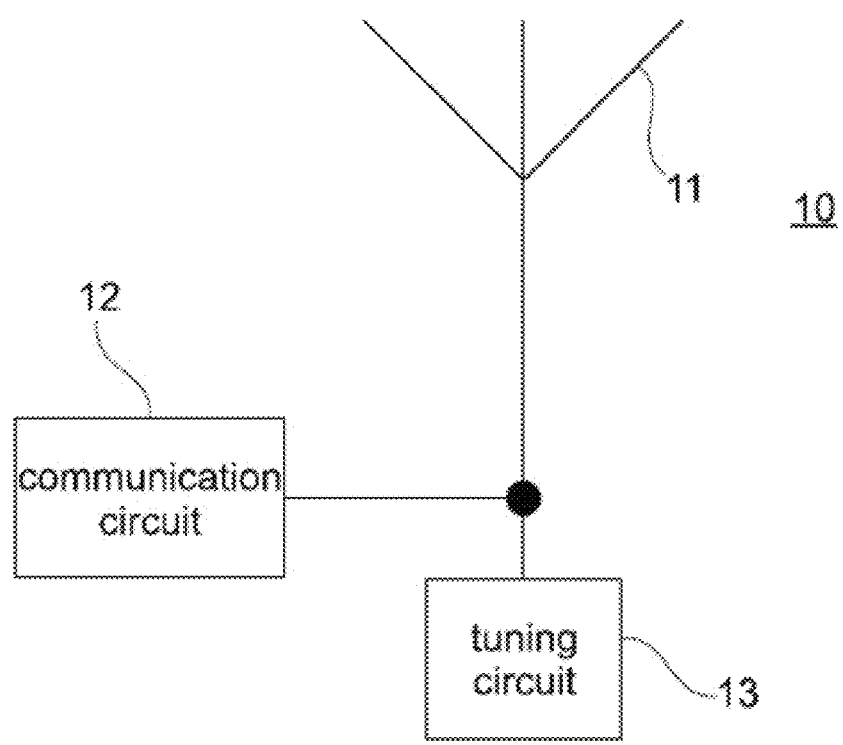
FIG. 1 is a schematic diagram illustrating a system including an antenna, a communication circuit, and a tuning circuit, according to an embodiment.

FIG. 1 is a high level block diagram of an example system 10 according to some embodiments. System 10 comprises an antenna 11 coupled to a communication circuit 12. Communication circuit 12 may be a circuit in a communication device, for example a mobile phone or other communication device, which is configured to transmit radio frequency (RF) signals via antenna 11, to receive signals via antenna 11 or both. While a single antenna 11 is shown, single antenna 11 may in fact represent a plurality of antennas, for example a plurality of antennas of in a phased array.

Furthermore, system 10 comprises a tuning circuit 13 coupled to antenna 11. Tuning circuit 13 comprises reactive tuning elements such as capacitors and inductors, which may be selectively coupled to antenna 11 via a plurality of switches, which may be provided as an integrated switch device. Such a switch device may be implemented in an RFIC according to embodiments as discussed below, to provide different kinds of couplings in the same system, for example different kinds of couplings for tuning capacitors and tuning inductors, as will be described below in further detail.

Switch devices according to different embodiments are described below with particular reference to FIGS. 5, 8A, and 8B. Switch devices described herein may comprise a plurality of ports. The ports may be used to couple external components to the switch device. The switch devices may be integrated switch devices implemented on a single chip, such as an RFIC. In other embodiments, they may include two or more chips integrated in a single package. The switch devices comprise one or more stacked transistor switches which are described below with reference to FIG. 2.

Figure 2:
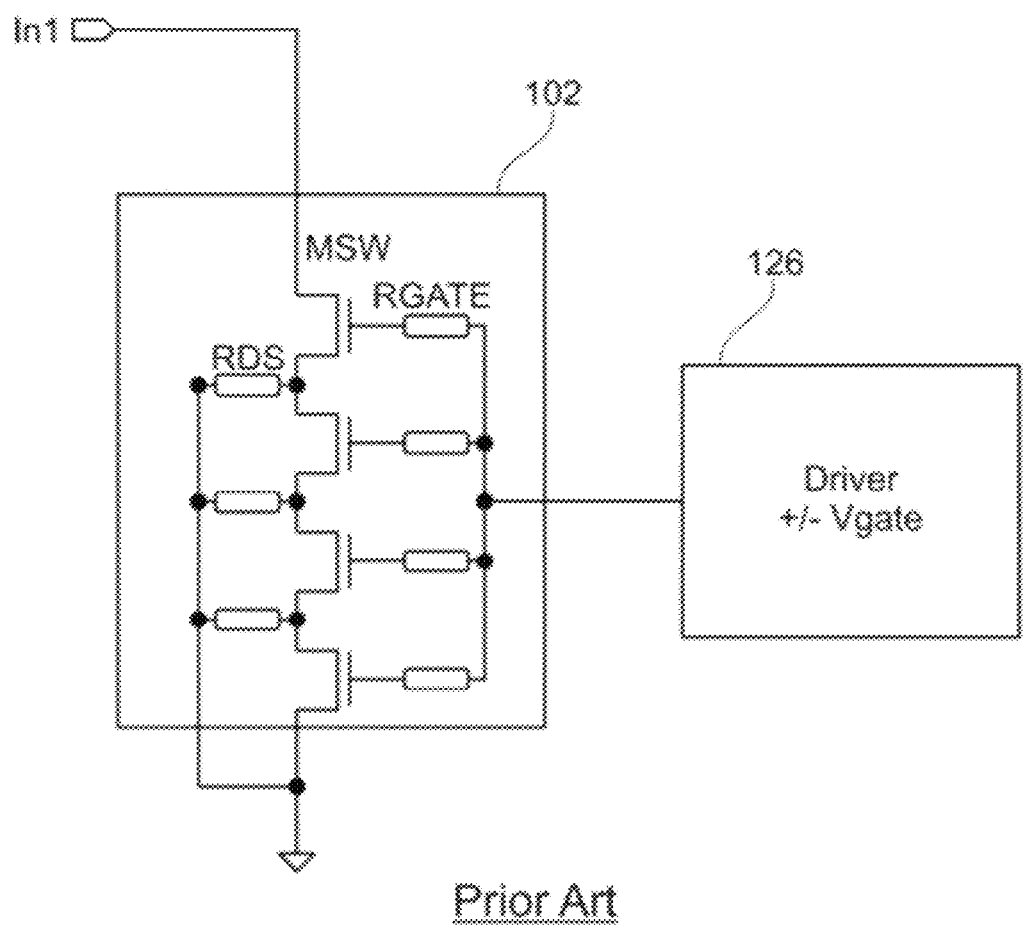
FIG. 2 is a schematic diagram illustrating a system including an exemplary stacked MOS transistor RF switch, and a corresponding driver coupled to the RF switch.

FIG. 2 illustrates a detailed view of an example shunt RF switch 102 and a corresponding driver 126. Example shunt RF switch 102 is one example of a high voltage stacked transistor switch including a plurality of transistors, and a plurality of biasing resistors. Other examples and configurations of high voltage stacked transistor switches and corresponding resistors are known. As shown, shunt RF switch 102 is implemented using a plurality of stacked transistors that are series connected, each transistor MSW of which has a series gate resistor RGATE in a biasing arrangement. Such stacking is used, for example, to prevent breakdown in the presence of high RF voltage swings. As is further shown, the common source/drain nodes of the transistors MSW are coupled to ground via resistors RDS in a biasing arrangement. In one example, resistors RDS may be about 400 kOhms. Other values, however, may be used. The switch circuit of RF switch 102 may be implemented using FET transistors in a CMOS-Bulk, CMOS-SOI using thin or thick film silicon on insulator (SOI), GaAs-HEMTs, or other FET transistor type technology. In some cases, diodes having an undoped intrinsic semiconductor region between a P-type semiconductor and an N-type semiconductor region (PIN diodes) may also be used. As shown in FIG. 2, transistor MSW is implemented using an NMOS device. Transistor MSW, however, may be implemented using a PMOS device, or other transistor type. The above description of an exemplary RF switch and an exemplary RF switch system can also be applied in its entirety to embodiments of the present invention.

During operation, driver 126 provides a negative voltage to the gates of transistors MSW within RF switch 102 in order to isolate node In1 from ground by turning transistors MSW off. To provide a conductive path from node In1 to ground, a positive voltage is applied to the gates of transistors MSW within switch 102 in order to turn on transistors MSW. In some embodiments, additional DC blocking capacitors (not shown in FIG. 2), may be coupled to input node In1 to ensure a symmetric RF swing. Such DC blocking capacitors are utilized, for example, when a DC voltage is present on the RF line. In some embodiments where there is no DC voltage on the RF line, DC blocking capacitors are not used. For RF switches that do not have a negative bias on the MOS transistors, DC blocking is typically used. Such situations may occur, for example, in systems in which the gate of a transistor is switched between a positive voltage and ground, as is commonly the case with circuits implemented using GaAs HEMT switch technologies. It should be further understood that the polarity of the activation and deactivation voltages may be different when other transistor types besides NMOS devices are used. For example, in embodiments that utilize PMOS devices, the activation voltage may be lower than the deactivation voltage.

Equivalent circuits of a single cell having one transistor of a stacked transistor switch and of a plurality of cells in a stacked transistor switch are described below with respect to FIG. 3A, FIG. 3B, FIG. 4A, and FIG. 4B, wherein resistor and capacitor components represent the equivalent AC resistance and capacitance of the cell or plurality of cells in a stacked transistor switch. According to embodiments, at least two stacked transistor switches are used in an RFIC. According to those embodiments, there are certain relationships between the values of the resistance and capacitance of the equivalent circuit resistor and capacitor components of the at least two stacked transistor switches. Those relationships are explained in greater detail with respect to FIG. 5. However, the AC equivalent circuits themselves are described first with respect to FIGS. 3A, FIG. 3B, FIG. 4A, and FIG. 4B.

Figure 3A:
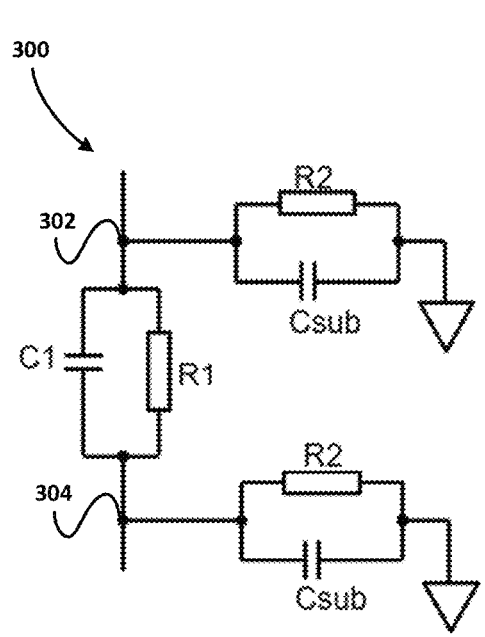
FIG. 3A is a schematic diagram illustrating an equivalent circuit of a single cell of an exemplary MOS transistor RF switch.

FIG. 3A is a schematic diagram illustrating an AC equivalent circuit of a single cell 300 of an exemplary MOS transistor RF switch. Single cell 300 is coupled between node 302 and node 304, wherein a capacitor C1 and a resistor R1 are coupled in parallel between node 302 and node 304, wherein a capacitor Csub and a resistor R2 are coupled in parallel between node 302 and ground, and wherein a capacitor Csub and a resistor R2 are coupled in parallel between node 304 and ground. Resistor R1 is the series resistance due to parasitic resistances and the resistance of the biasing resistors, and resistor is R2 the shunt resistance due to parasitic resistances and the resistance of the biasing resistors. Capacitor C1 is the drain-source capacitance, and capacitor Csub is the substrate capacitance.

Figure 3B:
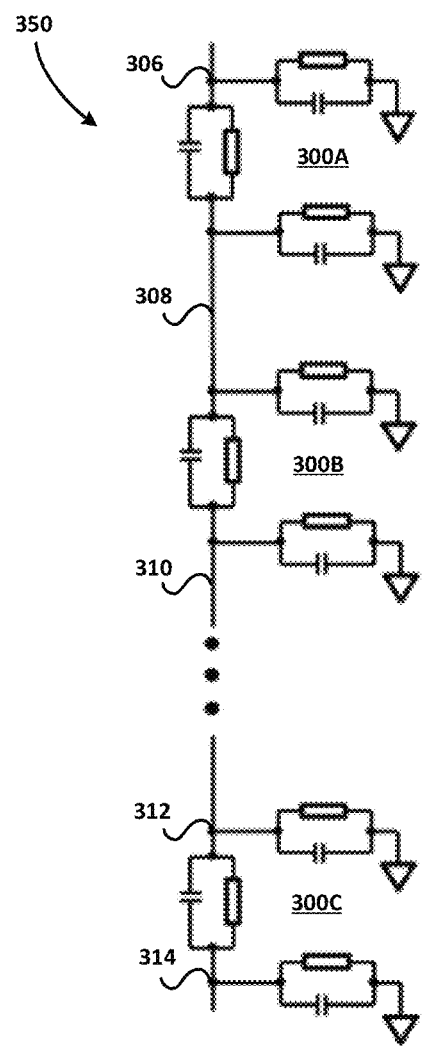
FIG. 3B is a schematic diagram illustrating an equivalent circuit of an exemplary stacked MOS transistor RF switch.

FIG. 3B is a schematic diagram illustrating an AC equivalent circuit of an exemplary stacked MOS transistor RF switch 350 comprising a first cell 300A coupled between nodes 306 and 308, a second cell 300B coupled between nodes 308 and 310, and a third cell 300C coupled between nodes 312 and 314. The R1, C1, R2, and Csub labels are omitted in FIG. 3B for clarity. While only three cells are shown in FIG. 3B, any number of switch cells can be used corresponding to the number of stacked transistor used in the transistor switch.

The equivalent circuit of the stacked transistor switch can be further characterized by whether or not the transistors in the stacked transistors switch are in the OFF mode of operation or in the ON mode of operation. These equivalent circuits are described in further detail below with respect to FIG. 4A (OFF mode) and FIG. 4B (ON mode).

Figure 4A:
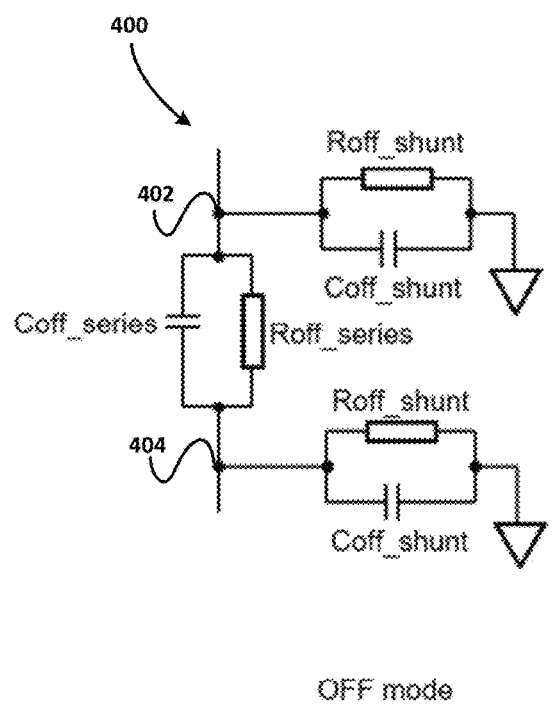
FIG. 4A is a schematic diagram illustrating an equivalent circuit of a single cell of an exemplary MOS transistor RF switch in an OFF mode of operation.

FIG. 4A is a schematic diagram illustrating an equivalent circuit of a single cell 400 of an exemplary MOS transistor RF switch in an OFF mode of operation. Single cell 400 is coupled between node 402 and node 404, wherein a capacitor Coff_series and a resistor Roff_series are coupled in parallel between node 402 and node 404, wherein a capacitor Coff_shunt and a resistor Roff_shunt are coupled in parallel between node 402 and ground, and wherein a capacitor Coff_shunt and a resistor Roff_shunt are coupled in parallel between node 404 and ground. Resistor Roff_series is the equivalent series resistance in the OFF mode of operation, and resistor Roff_shunt is the equivalent shunt resistance in the OFF mode of operation. Capacitor Coff_series is the equivalent series capacitance in the OFF mode of operation, and capacitor Coff_shunt is the equivalent shunt capacitance in the OFF mode of operation.

Figure 4B:
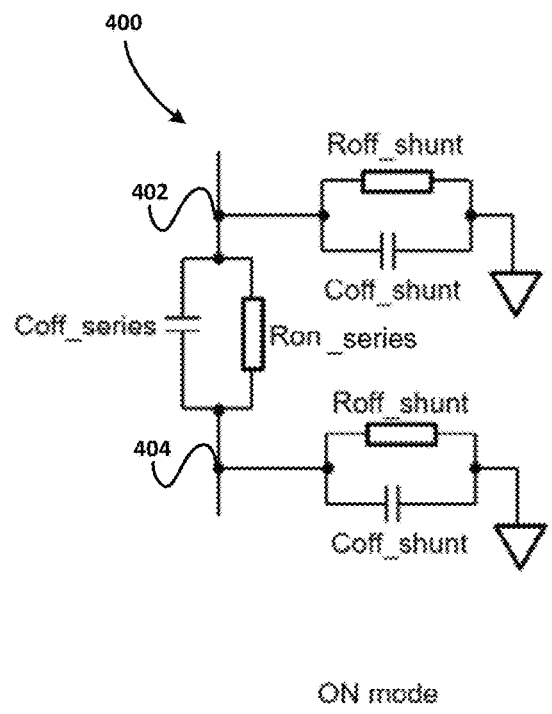
FIG. 4B is a schematic diagram illustrating an equivalent circuit of a single cell of an exemplary MOS transistor RF switch in an ON mode of operation.

FIG. 4B is a schematic diagram illustrating an equivalent circuit of the single cell 400 of the exemplary MOS transistor RF switch in an ON mode of operation. In the equivalent circuit used, only the series resistance is changed in the ON mode of operation. Resistor Ron_series is the equivalent series resistance in the ON mode of operation. All of the other capacitances and resistances are the same and thus the labels have not changed and are the same as shown in FIG. 4A.

A communication system including an antenna, a tuning element and an RFIC are described below with respect to FIGS. 5A and 5B, according to embodiments. The RFIC is implemented with two RF switches (SW1 and SW2) that are sized to provide certain relationships between the equivalent circuit components in order to advantageously achieve reduction of voltage stress during switching transients while maintaining acceptable power losses during the OFF mode of operation. As will be described in further detail below with respect to FIGS. 5A and 5B, a first switch (SW1) is coupled between the a first RF port (PORT 1) and a second port (PORT 2), and a second switch (SW2) is coupled between PORT 1 and a ground (GND) connection in the RFIC.

In an embodiment, the size of the equivalent circuit components of SW1 and SW2 are described by the following equations:

Ron_series(SW1)>Ron_series(SW2);

Coff_shunt(SW1)<Coff_shunt(SW2);

Coff_series(SW1)<Coff_series(SW2);

Roff_shunt(SW1)>Roff_shunt(SW2); and

Roff_series(SW1)>Roff_series(SW2);

The above relationships can be achieved by appropriately sizing the layout area of the transistors in SW1 with respect to the layout area of the transistors in SW2. For example, a very low drain-to-source resistance (as well as other transistor resistances) can be achieved by increasing the area of the transistor, whereas transistor capacitances become higher as layout area increases. Conversely, smaller transistors will generally have higher resistances but smaller capacitances.

In an embodiment of switch SW1, twenty switch cells are stacked and, for each stack cell, the equivalent circuit elements have the following values: Coff_series=0.8 pF, Coff_shunt=1 fF, Ron_series=0.5 Ohm, Roff_series=15 kOhm, and Roff_shunt=1500 kOhm. In an embodiment of switch SW2, twenty switch cells are stacked and, for each stack cell, the equivalent circuit element have the following values: Coff_series=4 pF, Coff_shunt=5 fF, Ron_series=0.1 Ohm, Roff_series=3 kOhm, and Roff_shunt=200 kOhm. Other numbers of switch cells can be used in other embodiments. Other sets of equivalent circuit element values can be used for other embodiments as long as the above relationships between the equivalent circuit elements for switches SW1 and SW2 described above are maintained.

These above equivalent circuit elements values for switches SW1 and SW2 can be realized from both the transistor design and the biasing circuits design. In some embodiment designs, the SW1. and SW2 differences are realized by adjusting the transistor size. For switch SW1, the transistors in the stack have a smaller gate width and/or longer gate length to have a higher Ron but lower Coff capacitance and higher shunt OFF state resistance. This sizing can apply to any type of switch devices that have similar Ron, Coff, and Roff tradeoffs such as the MOSFET-like devices such as High-Electron-Mobility (HEMT) devices, diodes, as well as other such devices. However, if switches SW1 and SW2 are fabricated on a single integrated circuit, both transistors can be either N-channel or P-channel devices.

Figure 5A:
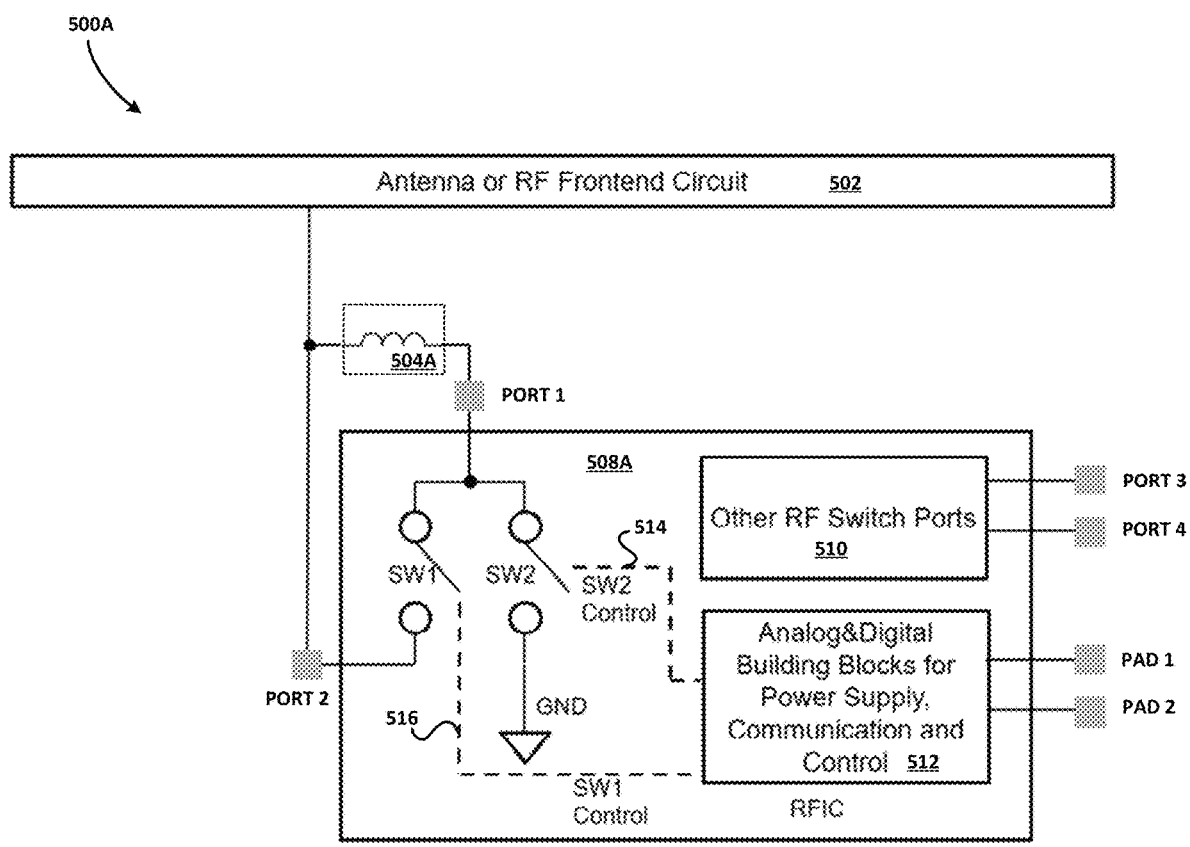
FIG. 5A is a schematic diagram illustrating a system including an antenna or RF frontend circuit, a tuning element, and an RFIC including a communication circuit and a tuning circuit, according to an embodiment, configured for operating in a first mode of operation.

FIG. 5A is a schematic diagram illustrating a system 500A including an antenna or RF frontend circuit 502, a tuning element 504A, and an RFIC 508A including switch SW1, switch SW2, one or more other switches 510, and control circuit block 512, according to an embodiment, configured for operating in a first mode of operation. The first mode of operation is used for either coupling antenna 502 to ground through the tuning element 504A, or bypassing tuning element 504A for coupling antenna 502 to directly to ground. The above recited components generally correspond to the communication circuit 12 and the tuning circuit 13 shown in FIG. 1. In an embodiment, switches SW1 and SW2 can comprise stacked MOS transistor RF switches.

Antenna 502 can include one or more antennas configured for receiving signals from a 5G mobile network, or other generation mobile networks. Antenna 502 can also be configured for receiving other types of signals not necessarily associated with a mobile network. In an embodiment, tuning element 504A comprises an inductor, but a capacitor can also be used for some applications. RFIC 508A includes a number of switch ports and integrated circuit pads for interfacing with the antenna 502 and with other processing components (not shown). While the switch ports are specifically labeled as switch ports, they may also be implements as integrated circuit pads in embodiments. RFIC 508A thus includes a first switch port PORT 1, a second switch port PORT 2, a third switch port PORT 3, and a fourth switch port PORT 4. Further switch ports can be added in embodiments. RFIC also includes integrated circuit pads PAD 1 and PAD2, but further integrated circuit pads can also be added in embodiments. The first switch SW1 is coupled between the first switch port PORT 1 and the second switch port PORT 2, and second switch SW2 is coupled between the first switch port PORT 1 and an internal ground connection GND. Switches 510 are coupled to the third port PORT 3 and the fourth port PORT 4, as well as additional switch ports in other embodiments. The control circuit block 512 includes analog and digital circuits for power supplies, communication circuits, as well as control circuits for controlling switches SW1 and SW2. Additional circuits can be added to the control circuit block for providing additional functions in some embodiments. The communication circuits can be configured for transmitting and receiving cellular network signals, or other communication signals in other embodiments. The control circuit block 512 is coupled to RFIC integrated circuit pads PAD 1 and PAD2, but can be coupled to additional integrated circuit pads for receiving DC voltages, such as power supply and ground voltages, clock signals, and for interacting with input/output signals such as data signals. Control circuit block 512 generates an SW1. Control signal for coupling to a control terminal of switch SW1. In an embodiment, the control terminal can comprise a gate of an MOS transistor in switch SW1. Control circuit block 512 also generates an SW2 Control signal for coupling to a control terminal of switch SW1. In an embodiment, the control terminal can of switch SW2 can comprise a gate of an MOS transistor in switch SW2.

The first mode of operation includes an OFF mode for switching OFF the coupling path between tuning element 504A and GND. In the OFF mode, switch SW1 is turned ON, and switch SW2 is turned OFF. There is no specific switching time sequence requirement in the OFF mode, and thus the switching transients of transistors SW1 and SW2 can be concurrent or slightly delayed relative to each other. The first mode of operation also includes an ON mode for switching ON the coupling path between tuning element 504A and GND. In the ON mode of the first mode of operation, switch SW1 is turned OFF, and switch SW2 is turned ON. There is also no specific switching time sequence requirement in the ON mode, and thus the switching transients of transistors SW1 and SW2 can be concurrent or slightly delayed relative to each other.

When switch SW2 is OFF and there is no switch SW1 in the circuit, an inductive-capacitive resonance circuit is formed wherein the inductive component is the tuning element 504A and the capacitive element is the parasitic OFF mode capacitance of switch SW2. When SW1 is implemented as described above and placed in the ON mode, a low ON resistance is coupled across the tuning element 504A. In a high frequency range, the inductive impedance of tuning element 504A is much higher than the low ON resistance of switch SW1, so that current flows mainly through switch SW1 instead of tuning element 504A and as a result, excessive resonance is avoided.

Figure 5B:
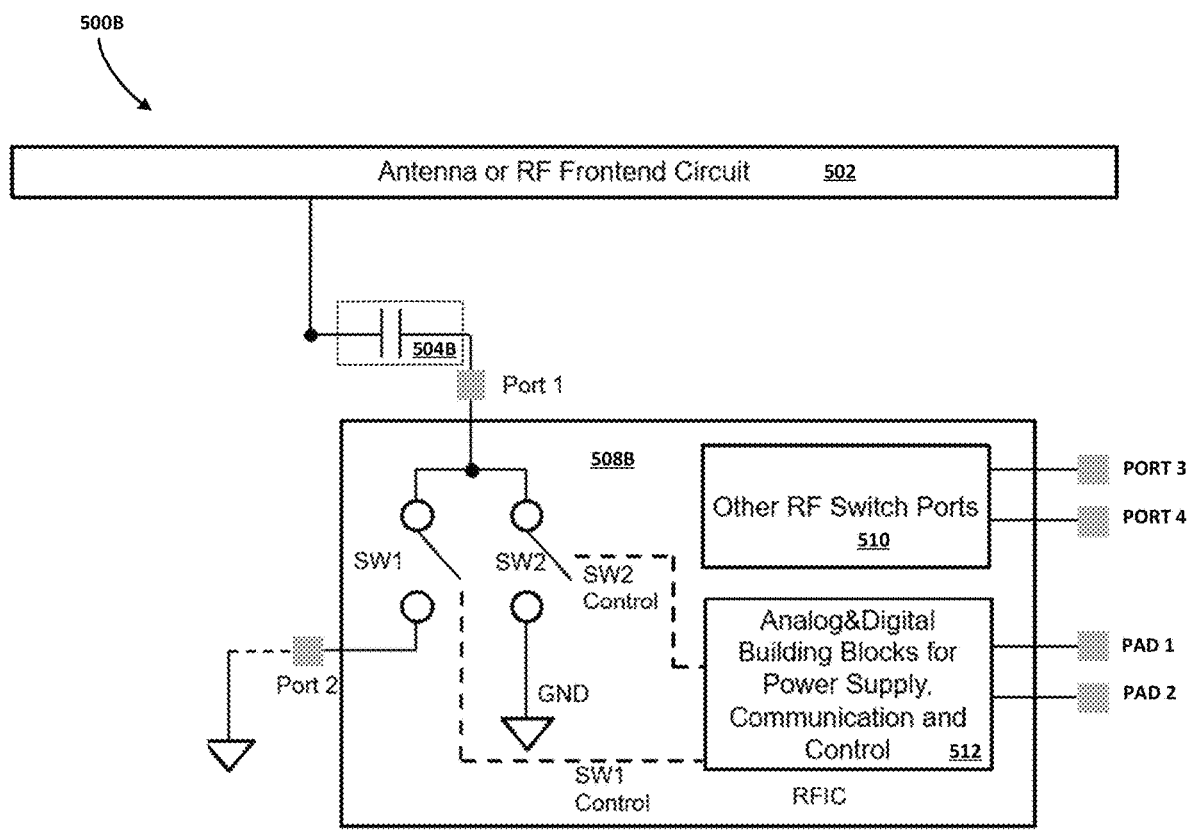
FIG. 5B is a schematic diagram illustrating a system including an antenna or RF frontend circuit, a tuning element, and an RFIC including a communication circuit and a tuning circuit, according to an embodiment, configured for operating in a first mode of operation.

FIG. 5B is a schematic diagram illustrating a system 500B including substantially the same components according to an embodiment, but configured for operating in a second mode of operation. System 500B includes a capacitive tuning element 504B coupled between antenna 502 and PORT 1 of RFIC 508B. PORT 2 is optionally coupled to ground. RFIC 508B, while being substantially the same as RFIC 508A, is configured for operating in the second mode of operation.

The second mode of operation includes an OFF mode for uncoupling tuning element 504B from GND. In the OFF mode, switch SW1 is turned OFF, and switch SW2 is turned OFF. There is no specific switching time sequence requirement in the OFF mode, and thus the switching transients of transistors SW1 and SW2 can be concurrent or slightly delayed relative to each other. The second mode of operation also includes an ON mode for switching ON the coupling path between tuning element 504B and GND. In the ON mode of the second mode of operation, switch SW1 is turned ON, and switch SW2 is turned ON. There is also no specific switching time sequence requirement in the ON mode, and thus the switching transients of transistors SW1 and SW2 can be concurrent or slightly delayed relative to each other.

Figure 6:
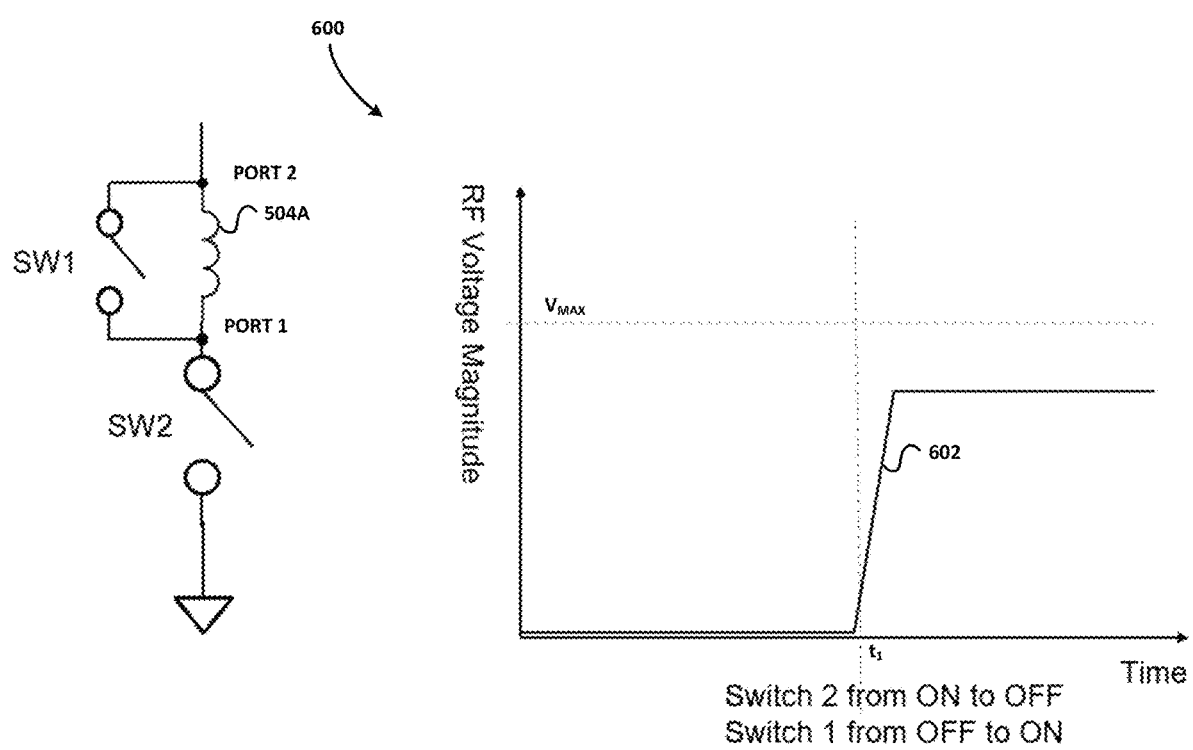
FIG. 6 is a timing diagram of the peak voltage performance of the tuning circuit of FIG. 5, according to an embodiment.

FIG. 6 is a timing diagram 600 of the peak voltage performance of the tuning circuit and system 500A of FIG. 5, according to an embodiment. FIG. 6, at a left portion of the figure, partially reproduces the tuning circuit, including PORT 1, PORT 2, and the ground connection. An inductive tuning element 504A and a first switch SW1 is coupled between PORT 1 and PORT 2. A second switch SW2 is coupled between PORT 2 and ground. When first switch SW1 is switched from OFF to ON, and when second switch SW2 is switched from ON to OFF, at time t1, voltage 602 changes from a low voltage level to a high voltage level. Voltage 602 can represent the voltage at PORT1. Due to the topology and sizing of switches SW1 and SW2, as described herein according to an embodiment, peaking at or near time t1 is prevented from exceeding a maximum voltage $V_{MAX}$. The value of $V_{MAX}$ is associated with a maximum voltage that can be tolerated by the stacked transistor switches SW1 and SW2 for a given semiconductor process. Excessive peaking at or near time t1 present in prior art solutions would require additional stacked transistor cell switches, which would increase integrated circuit size and lead to increases manufacturing costs.

Figure 7:
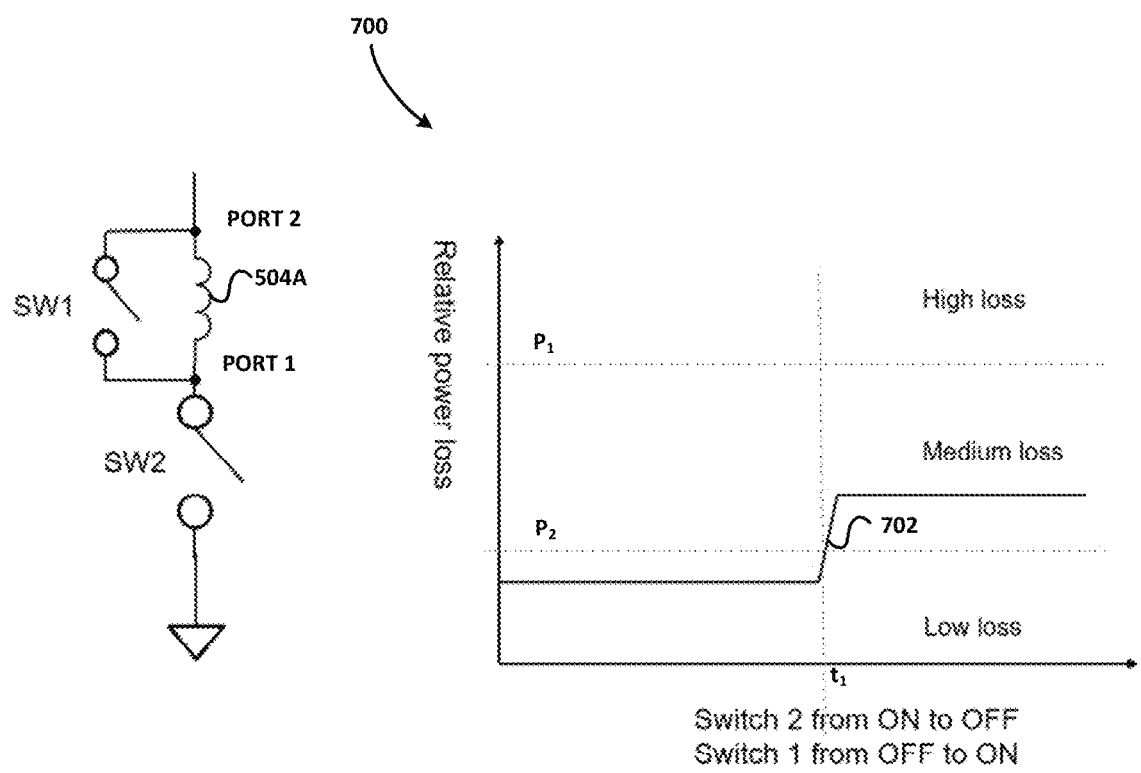
FIG. 7 is a timing diagram of the power loss performance of the tuning circuit of FIG. 5, according to an embodiment.

FIG. 7 is a timing diagram 700 of the power loss performance of the tuning circuit of FIG. 5 and system 500A, according to an embodiment. FIG. 7 partially reproduces the tuning circuit, including PORT 1, PORT 2, the ground connection, and the inductive tuning element 504A previously discussed. When first switch SW1 is switched from OFF to ON, and when second switch SW2 is switched from ON to OFF, at time t1, the power loss switches from a low power loss less than power level P2 to a medium power loss between power level P1 and power level P2. Due to the topology and sizing of switches SW1 and SW2, as described herein according to an embodiment, power loss is prevented from exceeding power level P2. The value of power loss level P1 is associated with a low level of power loss, and the value of power loss level P2 is associated with a medium level of power loss that is acceptable in many applications. Power loss levels greater than power loss level P3 P2 is associated with a high level of power loss that is unacceptable in many applications. Excessive power loss present in prior art solutions would require changes to the stacked transistor switches that could impact performance during the ON mode of operation of the stacked transistor switch.

Figure 8A:
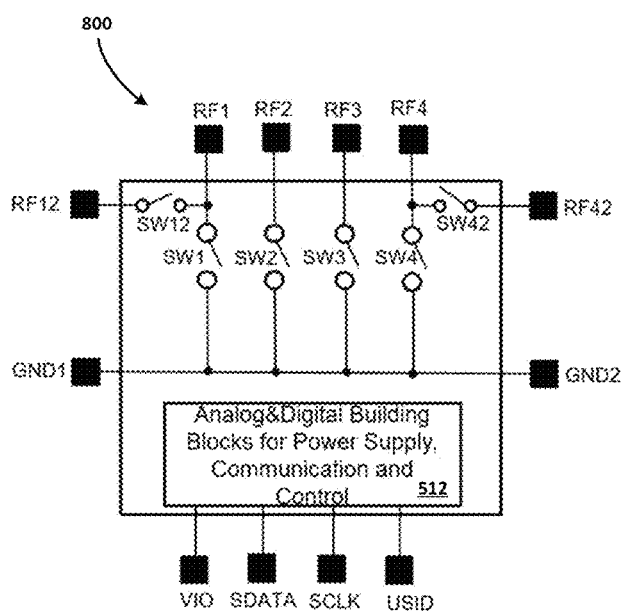
FIG. 8A is a detailed schematic diagram of the RFIC of FIG. 5, according to an embodiment.

FIG. 8A is a detailed schematic diagram of an RFIC Boo generally corresponding the RFIC 508A of FIG. 5, according to an embodiment. In FIG. 8A switches SW12 and SW1 generally correspond to switches SW1 and SW2 shown in FIG. 5. RFIC 800 includes six stacked transistor RF switches and six corresponding switch ports, as well as control circuit 512. Switch SW12 is coupled between switch ports RF12 and RF1, switch SW2 is coupled between switch port RF2 and ground, switch SW3 is coupled between switch port RF3 and ground, switch, switch SW4 is coupled between switch port RF4 and ground, and switch SW42 is coupled between switch port RF4 and switch port RF42. In an embodiment, switch ports RF12, RF1, RF2, RF3, RF4, and RF42 comprise integrated circuit bonding pads. RFIC 800 also comprises other bonding pads, including:

| | |
|---|---|
| GND$_1$ | to couple the system ground to the IC internal ground; |
| GND$_2$ | to couple the system ground to the IC internal ground; |
| VIO | power supply; |
| SDATA | data signal interface under the MIPI standard; |
| SCLK | clock signal interface under the MIPI standard; and |
| USID | to select a different default user ID. |

The control circuit 512 is coupled to at least the GND1, GND2, VIO, SDATA, SCLK, and USID bonding pads in an embodiment. Additional bonding pads may be used, for example, for receiving additional power supply voltages, or receiving or supplying additional analog or digital signals.

Figure 8B:
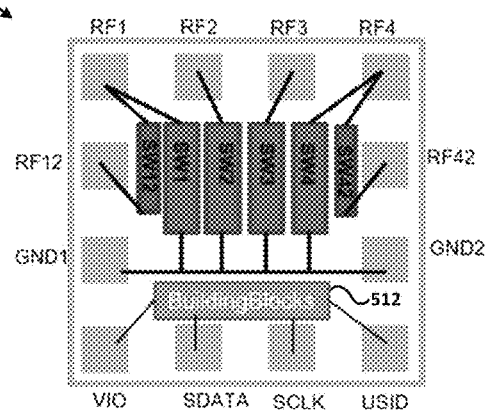
FIG. 8B is a detailed plan view layout diagram of the RFIC of FIG. 5, according to an embodiment.

FIG. 8B is a detailed plan view layout diagram 850 of RFIC Boo, according to an embodiment. In integrated circuit layout diagram 850 illustrates a first stacked transistor switch (SW12) having a current path coupled between a first tuning element port (RF12) and a second tuning element port (RF1); a second stacked transistor switch (SW1) having a current path coupled between the first tuning element port (RF12) and a ground port (GND1, GND2); and a control circuit (512) coupled to a control node of the first stacked transistor switch (SW12) and coupled to a control node of the second stacked transistor switch (SW1), wherein a series on-resistance of the first stacked transistor switch (SW12) is greater than a series on-resistance of the second stacked transistor (SW1). The integrated circuit layout diagram 850 further illustrates a third stacked transistor switch (SW42) having a current path coupled between a third tuning element port (RF42) and a fourth tuning element port (RF4); and a fourth stacked transistor switch (SW4) having a current path coupled between the third tuning element port (RF42) and the ground port (GND1, GND2), wherein the control circuit (512) is coupled to a control node of the third stacked transistor switch (RF42) and coupled to a control node of the fourth stacked transistor switch (SW4), and wherein a series on-resistance of the third stacked transistor switch (SW42) is greater than a series on-resistance of the fourth stacked transistor switch (SW4).

The integrated circuit layout diagram 850 illustrates at least one additional stacked transistor switch (SW2, SW3) having a current path coupled between at least one additional switch port (RF2, RF3) and the ground port (GND1, GND2), wherein the at least one additional stacked transistor switch is arranged in a central portion of the integrated circuit 800. The integrated circuit layout diagram 850 also illustrates that the first stacked transistor switch (SW12) and the second stacked transistor switch (SW1) are arranged in a first portion of integrated circuit 800 adjacent to the central portion of the integrated circuit, and wherein the third stacked transistor switch (SW42) and the fourth stacked transistor switch (SW4) are arranged symmetrically in a second portion of integrated circuit 800 adjacent to the central portion of the integrated circuit.

Figure 9:
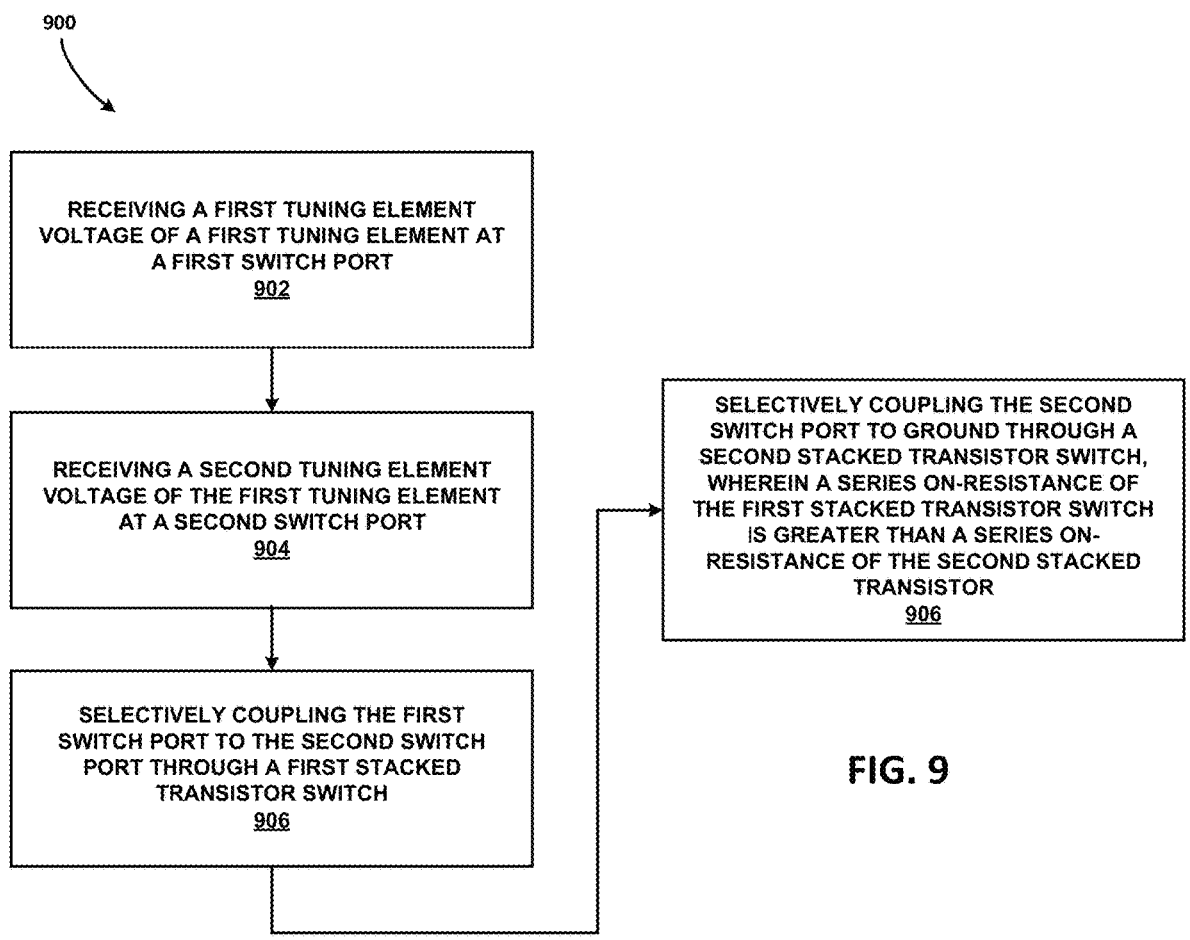
FIG. 9 is a flow chart of an antenna tuning method, according to an embodiment.

FIG. 9 is a flow chart of an antenna tuning method 900, according to an embodiment comprising receiving a first tuning element voltage of a first tuning element at a first switch port at step 902; receiving a second tuning element voltage of the first tuning element at a second switch port 904; selectively coupling the first switch port to the second switch port through a first stacked transistor switch at step 906; and selectively coupling the second switch port to ground through a second stacked transistor switch, wherein a series on-resistance of the first stacked transistor switch is greater than a series on-resistance of the second stacked transistor at step 906.

Example embodiments of the present invention are summarized here. Other embodiments can also be understood from the entirety of the specification and the claims filed herein.

Example 1. According to an embodiment, an integrated circuit includes a first stacked transistor switch having a current path coupled between a first tuning element port and a second tuning element port; a second stacked transistor switch having a current path coupled between the first tuning element port and a ground port; and a control circuit coupled to a control node of the first stacked transistor switch and coupled to a control node of the second stacked transistor switch, wherein a series on-resistance of the first stacked transistor switch is greater than a series on-resistance of the second stacked transistor.

Example 2. The integrated circuit of Example 1, further including a third stacked transistor switch having a current path coupled between a third tuning element port and a fourth tuning element port; and a fourth stacked transistor switch having a current path coupled between the third tuning element port and the ground port, wherein the control circuit is coupled to a control node of the third stacked transistor switch and coupled to a control node of the fourth stacked transistor switch, and wherein a series on-resistance of the third stacked transistor switch is greater than a series on-resistance of the fourth stacked transistor.

Example 3. The integrated circuit of any of the above examples, further including at least one additional stacked transistor switch having a current path coupled between at least one additional switch port and the ground port, wherein the at least one additional stacked transistor switch is arranged in a central portion of the integrated circuit.

Example 4. The integrated circuit of any of the above examples, wherein the first stacked transistor switch and the second stacked transistor switch are arranged in a first portion of the integrated circuit adjacent to the central portion of the integrated circuit, and wherein the third stacked transistor switch and the fourth stacked transistor switch are arranged symmetrically in a second portion of the integrated circuit adjacent to the central portion of the integrated circuit.

Example 5. The integrated circuit of any of the above examples, wherein a series off-capacitance of the first stacked transistor switch is less than a series off-capacitance of the second stacked transistor switch.

Example 6. The integrated circuit of any of the above examples, wherein a shunt off-capacitance of the first stacked transistor switch is less than a shunt off-capacitance of the second stacked transistor switch.

Example 7. The integrated circuit of any of the above examples, wherein a series equivalent off-resistance at radio frequency of the first stacked transistor switch is greater than a series equivalent off-resistance at radio frequency of the second stacked transistor switch.

Example 8. The integrated circuit of any of the above examples, wherein a shunt equivalent off-resistance at radio frequency of the first stacked transistor switch is greater than a shunt equivalent off-resistance at radio frequency of the second stacked transistor switch.

Example 9. The integrated circuit of any of the above examples, wherein the control circuit is coupled to at least of a power supply pin, a data pin, or a clock pin of the integrated circuit.

Example 10. The integrated circuit of any of the above examples, wherein the control circuit is coupled to a user identification pin of the integrated circuit.

Example 11. According to an embodiment, a system includes an antenna tuning circuit including a first tuning element; a first stacked transistor switch having a current path coupled between a first node of the first tuning element and a second node of the first tuning element; a second stacked transistor switch having a current path coupled between the first node of the first tuning element and ground; and a control circuit coupled to a control node of the first stacked transistor switch and coupled to a control node of the second stacked transistor switch, wherein a series on-resistance of the first stacked transistor switch is greater than a series on-resistance of the second stacked transistor.

Example 12. The system of Example 11, further including a second tuning element of the antenna tuning circuit; a third stacked transistor switch having a current path coupled between a third node of the second tuning element and a fourth node of the second tuning element; and a fourth stacked transistor switch having a current path coupled between the third node of the second tuning element and ground, wherein the control circuit is coupled to a control node of the third stacked transistor switch and coupled to a control node of the fourth stacked transistor switch, and wherein a series on-resistance of the third stacked transistor switch is greater than a series on-resistance of the fourth stacked transistor.

Example 13. The system of any of the above examples, wherein the first stacked transistor switch, the second stacked transistor switch, the third stacked transistor switch, the fourth stacked transistor switch, and the control circuit are fabricated on a single integrated circuit.

Example 14. The system of any of the above examples, wherein the single integrated circuit includes at least one additional stacked transistor switch.

Example 15. The system of any of the above examples, wherein a series off-capacitance of the first stacked transistor switch is less than a series off-capacitance of the second stacked transistor switch, wherein a shunt off-capacitance of the first stacked transistor switch is less than a shunt off-capacitance of the second stacked transistor switch, wherein a series equivalent off-resistance at radio frequency of the first stacked transistor switch is greater than a series equivalent off-resistance at radio frequency of the second stacked transistor switch, and wherein a shunt equivalent off-resistance at radio frequency of the first stacked transistor switch is greater than a shunt equivalent off-resistance at radio frequency of the second stacked transistor switch.

Example 16. According to an embodiment, a method includes receiving a first tuning element voltage of a first tuning element at a first switch port; receiving a second tuning element voltage of the first tuning element at a second switch port; selectively coupling the first switch port to the second switch port through a first stacked transistor switch; and selectively coupling the second switch port to ground through a second stacked transistor switch, wherein a series on-resistance of the first stacked transistor switch is greater than a series on-resistance of the second stacked transistor.

Example 17. The method of Example 16, wherein the method is performed in a single integrated circuit.

Example 18. The method of any of the above examples, further includes receiving a third tuning element voltage of a second tuning element at a third switch port; receiving a fourth tuning element voltage of the second tuning element at a fourth switch port; selectively coupling the third switch port to the fourth switch port through a third stacked transistor switch; and selectively coupling the second switch port to ground through a fourth stacked transistor switch, wherein a series on-resistance of the third stacked transistor switch is greater than a series on-resistance of the fourth stacked transistor.

Example 19. The method of any of the above examples, wherein the method is performed in a single integrated circuit.

Example 20. The method of any of the above examples, further including symmetrically arranging the first stacked transistor switch with the third stacked transistor switch in the single integrated circuit, and symmetrically arranging the second stacked transistor switch with the fourth stacked transistor switch in the integrated circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
   a first stacked transistor switch having a current path coupled between a first tuning element port and a second tuning element port;
   a second stacked transistor switch having a current path coupled between the first tuning element port and a ground port; and
   a control circuit coupled to a control node of the first stacked transistor switch and coupled to a control node of the second stacked transistor switch, wherein a series on-resistance of the first stacked transistor switch is greater than a series on-resistance of the second stacked transistor, and wherein a series equivalent off-resistance at radio frequency of the first stacked transistor switch is greater than a series equivalent off-resistance at radio frequency of the second stacked transistor switch.

2. The integrated circuit of claim 1, further comprising:
   a third stacked transistor switch having a current path coupled between a third tuning element port and a fourth tuning element port; and
   a fourth stacked transistor switch having a current path coupled between the third tuning element port and the ground port,
   wherein the control circuit is coupled to a control node of the third stacked transistor switch and coupled to a control node of the fourth stacked transistor switch, and wherein a series on-resistance of the third stacked transistor switch is greater than a series on-resistance of the fourth stacked transistor.

3. The integrated circuit of claim 2, further comprising at least one additional stacked transistor switch having a current path coupled between at least one additional switch port and the ground port, wherein the at least one additional stacked transistor switch is arranged in a central portion of the integrated circuit.

4. The integrated circuit of claim 3, wherein the first stacked transistor switch and the second stacked transistor switch are arranged in a first portion of the integrated circuit adjacent to the central portion of the integrated circuit, and wherein the third stacked transistor switch and the fourth stacked transistor switch are arranged symmetrically in a second portion of the integrated circuit adjacent to the central portion of the integrated circuit.

5. The integrated circuit of claim 1, wherein a series off-capacitance of the first stacked transistor switch is less than a series off-capacitance of the second stacked transistor switch.

6. The integrated circuit of claim 1, wherein a shunt off-capacitance of the first stacked transistor switch is less than a shunt off-capacitance of the second stacked transistor switch.

7. The integrated circuit of claim 1, wherein a shunt equivalent off-resistance at radio frequency of the first stacked transistor switch is greater than a shunt equivalent off-resistance at radio frequency of the second stacked transistor switch.

8. The integrated circuit of claim 1, wherein the control circuit is coupled to at least of a power supply pin, a data pin, or a clock pin of the integrated circuit.

9. The integrated circuit of claim 1, wherein the control circuit is coupled to a user identification pin of the integrated circuit.

10. A system comprising:
an antenna tuning circuit comprising a first tuning element;
a first stacked transistor switch having a current path coupled between a first node of the first tuning element and a second node of the first tuning element;
a second stacked transistor switch having a current path coupled between the first node of the first tuning element and ground; and
a control circuit coupled to a control node of the first stacked transistor switch and coupled to a control node of the second stacked transistor switch, wherein a series on-resistance of the first stacked transistor switch is greater than a series on-resistance of the second stacked transistor, wherein a series off-capacitance of the first stacked transistor switch is less than a series off-capacitance of the second stacked transistor switch, wherein a shunt off-capacitance of the first stacked transistor switch is less than a shunt off-capacitance of the second stacked transistor switch, wherein a series equivalent off-resistance at radio frequency of the first stacked transistor switch is greater than a series equivalent off-resistance at radio frequency of the second stacked transistor switch, and wherein a shunt equivalent off-resistance at radio frequency of the first stacked transistor switch is greater than a shunt equivalent off-resistance at radio frequency of the second stacked transistor switch.

11. The system of claim 10, further comprising:
a second tuning element of the antenna tuning circuit;
a third stacked transistor switch having a current path coupled between a third node of the second tuning element and a fourth node of the second tuning element; and
a fourth stacked transistor switch having a current path coupled between the third node of the second tuning element and ground,
wherein the control circuit is coupled to a control node of the third stacked transistor switch and coupled to a control node of the fourth stacked transistor switch, and wherein a series on-resistance of the third stacked transistor switch is greater than a series on-resistance of the fourth stacked transistor.

12. The system of claim 11, wherein the first stacked transistor switch, the second stacked transistor switch, the third stacked transistor switch, the fourth stacked transistor switch, and the control circuit are fabricated on a single integrated circuit.

13. The system of claim 12, wherein the single integrated circuit comprises at least one additional stacked transistor switch.

14. A method comprising:
receiving a first tuning element voltage of a first tuning element at a first switch port;
receiving a second tuning element voltage of the first tuning element at a second switch port;
selectively coupling the first switch port to the second switch port through a first stacked transistor switch; and
selectively coupling the second switch port to ground through a second stacked transistor switch,
wherein a series on-resistance of the first stacked transistor switch is greater than a series on-resistance of the second stacked transistor, and wherein a series equivalent off-resistance at radio frequency of the first stacked transistor switch is greater than a series equivalent off-resistance at radio frequency of the second stacked transistor switch.

15. The method of claim 14, wherein the method is performed in a single integrated circuit.

16. The method of claim 15, further comprising:
receiving a third tuning element voltage of a second tuning element at a third switch port;
receiving a fourth tuning element voltage of the second tuning element at a fourth switch port;
selectively coupling the third switch port to the fourth switch port through a third stacked transistor switch; and
selectively coupling the second switch port to ground through a fourth stacked transistor switch,
wherein a series on-resistance of the third stacked transistor switch is greater than a series on-resistance of the fourth stacked transistor.

17. The method of claim 16, wherein the method is performed in a single integrated circuit.

18. The method of claim 17, further comprising symmetrically arranging the first stacked transistor switch with the third stacked transistor switch in the single integrated circuit, and symmetrically arranging the second stacked transistor switch with the fourth stacked transistor switch in the integrated circuit.

* * * * *